(12) United States Patent
Pannetier-Lecoeur et al.

(10) Patent No.: US 11,255,925 B2
(45) Date of Patent: *Feb. 22, 2022

(54) SYSTEM AND METHOD FOR SUPPRESSING LOW FREQUENCY NOISE OF MAGNETORESISTIVE SENSORS WITH TUNNEL MAGNETORESISTANCE

(71) Applicant: COMMISSARIAT À L'ÉNERGIE ATOMIQUE ET AUX ÉNERGIES ALTERNATIVES, Paris (FR)

(72) Inventors: Myriam Pannetier-Lecoeur, Bures sur Yvette (FR); Aurélie Solignac, Massy (FR); Vincent Trauchessec, Paris (FR); Claude Fermon, Orsay (FR)

(73) Assignee: COMMISSARIAT Â L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 63 days.

This patent is subject to a terminal disclaimer.

(21) Appl. No.: 16/618,612

(22) PCT Filed: Jun. 1, 2018

(86) PCT No.: PCT/EP2018/064504
§ 371 (c)(1),
(2) Date: Dec. 2, 2019

(87) PCT Pub. No.: WO2018/220194
PCT Pub. Date: Dec. 6, 2018

(65) Prior Publication Data
US 2020/0182947 A1 Jun. 11, 2020

(30) Foreign Application Priority Data
Jun. 2, 2017 (FR) .................................. 1754902

(51) Int. Cl.
G01R 33/09 (2006.01)
G01R 33/00 (2006.01)

(52) U.S. Cl.
CPC ......... *G01R 33/0029* (2013.01); *G01R 33/09* (2013.01)

(58) Field of Classification Search
CPC ................ G01R 33/09; G01R 33/0029; G01R 33/0041; G01R 33/093
See application file for complete search history.

(56) References Cited

U.S. PATENT DOCUMENTS

2008/0224695 A1* 9/2008 Leroy .................... G01R 33/09
324/252
2017/0168123 A1* 6/2017 Kandori ............... G01R 33/022

FOREIGN PATENT DOCUMENTS

EP 2 165 206 A1 3/2010
EP 2 165 210 A2 3/2010
(Continued)

OTHER PUBLICATIONS

International Search Report as issued in International Patent Application No. PCT/EP2018/064504, dated Jul. 3, 2018.

*Primary Examiner* — Alesa Allgood
(74) *Attorney, Agent, or Firm* — Pillsbury Winthrop Shaw Pittman LLP

(57) ABSTRACT

A system for suppressing low frequency noise of magnetoresistive sensors, includes a device for measuring a magnetic field, the device including at least one magnetoresistive sensor, the magnetoresistive sensor having a first sensitivity at a first operating point and a second sensitivity at a second operating point, the sensitivity at the second operating point being low or zero; a modulator configured to switch the at least one magnetoresistive sensor from the first operating point to the second operating point; and a signal processor (Continued)

for processing the signal derived from the device for measuring a magnetic field.

12 Claims, 12 Drawing Sheets

(56) References Cited

FOREIGN PATENT DOCUMENTS

| WO | WO 2009/001160 A1 | 12/2008 | |
|----|----|----|----|
| WO | WO 2009/001162 A2 | 12/2008 | |
| WO | WO-2009001160 A1 * | 12/2008 | ............. B82Y 25/00 |

* cited by examiner

SYSTEM AND METHOD FOR SUPPRESSING LOW FREQUENCY NOISE OF MAGNETORESISTIVE SENSORS WITH TUNNEL MAGNETORESISTANCE

CROSS-REFERENCE TO RELATED APPLICATIONS

This application is the U.S. National Stage of PCT/EP2018/064504, filed Jun. 1, 2018, which in turn claims priority to French patent application number 1754902 filed Jun. 2, 2017. The content of these applications are incorporated herein by reference in their entireties.

FIELD OF THE INVENTION

The present invention relates to a system and a method for suppressing low frequency noise of a magnetoresistive type sensor. Magnetoresistive sensors cover in particular tunnel magnetoresistance (TMR) type sensors or colossal magnetoresistance (CMR) type sensors.

PRIOR ART

The low frequency noise of magnetoresistive sensors such as TMRs is today considered as the major obstacle to their use in certain applications requiring very high detectivity in low frequencies. An example of these applications is the measurement of magnetic fields in biological media, such as the magnetic fields associated with physiological signals and in particular neural signals. These signals vary slowly, with frequencies less than 1 KHz and their detection is affected by the low frequency noise of the sensor used during the measurement.

For anisotropic magnetoresistance (AMR) type sensors, a change of current direction method makes it possible to suppress a part of their 1/f noise (see for example I. Mateos et al. "Low-frequency noise characterization of a magnetic field monitoring system using an anisotropic magnetoresistance", published in Sensors and Actuators A, Volume 235, 2015). This technique cannot be applied to GMRs and TMRs because their resistance and their change in resistance do not depend on the direction of current.

Techniques for modulating the field seen by the sensor may be applied. These techniques displace the operating point of the sensor outside of its low frequency noise. Examples of such techniques are described in the articles "Towards picoTesla Magnetic Field Detection Using a GMR-MEMS Hybrid Device" of A. Guedes et al., published in IEEE TRANSACTIONS ON MAGNETICS, Vol. 48, N. 11, Pages 4115-4118, 2012, and "Minimizing 1/f noise in magnetic sensor using a microelectromechanical system flux concentrator", of A. S. Edelstein et al., published in Journal of Applied Physics, Vol. 91, page 7795, 2002.

These publications propose using frequency modulated flux concentrators but this technique gives modest results and requires the use of MEMS (micro electro mechanical systems) to carry out a mechanical modulation.

In the particular case of sensors coupled to superconducting current loops, a modulation of the supercurrent can relatively efficiently suppress low frequency noise by also displacing the operating point of the sensor to higher frequency. Such solutions are described in the patent documents EP2165206 and EP2165210.

However, these techniques have several drawbacks such as difficulties of implementation, low efficiency or instead the use of superconducting materials which require specific conditions of use and may be expensive.

SUMMARY OF THE INVENTION

The invention aims to resolve the aforementioned problems by proposing a system for suppressing low frequency noise of magnetoresistive sensors with tunnel magnetoresistance, namely sensors including at least one tunnel magnetic TMR junction, this system being reliable, of low bulk and which can be produced industrially.

To this end, a first subject matter of the invention is a system for suppressing low frequency noise of magnetoresistive sensors with tunnel magnetoresistance, said suppression system including:
  A device for measuring a magnetic field, said device including at least one tunnel magnetoresistance sensor, said tunnel magnetoresistance sensor having a first sensitivity at a first operating point and a second sensitivity at a second operating point, the second sensitivity at the second operating point being different from the first sensitivity at the first operating point;
  Modulation means suited to switching the at least one tunnel magnetoresistance sensor from the first operating point to the second operating point and from the second operating point to the first operating point, said means having a first configuration corresponding to the first operating point and a second configuration corresponding to the second operating point;
  Means for processing the signal derived from the device for measuring a magnetic field, said processing means being suited to performing a linear combination of a first response of the measuring device in the presence of the magnetic field at the first operating point corresponding to the first configuration of the modulation means and a second response of the measuring device in the presence of the magnetic field at the second operating point corresponding to the second configuration of the modulation means.

Tunnel magnetoresistance sensor C is taken to signify an element having an electrical resistance dependent on the external magnetic field and including at least one TMR or CMR tunnel magnetic junction. In a TMR junction the passage of current takes place by tunnel effect through a thin insulator film placed between two ferromagnetic electrodes. The orientation of the magnetisation of one of the two electrodes depends on the external magnetic field. By measuring the variation in resistance at the terminals of the element C, it is possible to measure the external magnetic field. External magnetic field or magnetic field is taken to signify the magnetic field that it is wished to measure.

Each tunnel magnetoresistance sensor C used within the scope of the present invention has different operating points having different sensitivity.

The greater the difference in sensitivity between the two operating points retained for the implementation of the invention, the more reproducible and reliable will be the suppression of the low frequency noise.

Modulation means M are taken to signify means making it possible to modify periodically the sensitivity of the magnetoresistive sensors used. The means M may include a time variable voltage generator or a function generator.

Indeed, the principle of the invention is based on a property of tunnel magnetoresistance sensors which is given by the finite energy height of the tunnel barrier. Thus, by increasing the voltage at the terminals of the TMR, the sensitivity to the external field decreases, as is shown in FIG. 3b.

The modulation carried out by the means M is for example a periodic variation in the sensitivity of the magnetoresistive sensors C. The frequency of this modulation is greater than the frequency of the low frequency noise that it is wished to eliminate.

Means for processing the signal T are taken to signify means used to select the response M1 of the device D when the tunnel magnetoresistance sensors are at the first operating point and the response M2 of the device D when the sensors are at the second operating point. The means for processing the signal T are also suited to making a linear combination of the responses M1 and M2. The processing means T may include analogue circuits, digital circuits or a mixture of analogue and digital circuits.

The low frequency noise associated with a magnetoresistive sensor C is, as in all conductors, a fluctuation in resistance noise. Furthermore, the external field also creates for its part a change in resistance. In the case of use of a magnetoresistive sensor to measure a slowly variable magnetic field, the two variations in resistance thus cannot be separated by a single measurement.

The proposed invention is based on a principle different to those proposed until now. It consists in making the magnetoresistive sensor with tunnel magnetoresistance C oscillate between two different operating points. The two points are chosen in such a way that the response to an external magnetic field is different. The response of the sensor to the external magnetic field is also called sensitivity of the sensor. The oscillation of the sensor between two different operating points is also called modulation of the sensitivity of the sensor.

In other words, the invention consists in making the sensor oscillate between these two measurement points at a more rapid frequency than the 1/f noise domain as indicated in FIG. 2 and thus measuring at high frequency the response of the sensor in each state. Two independent curves, M1 and M2, are thereby obtained, the two curves being time dependent. A linear combination of these two curves makes it possible to obtain a curve uniquely dependent on the external field and a curve giving internal fluctuations in resistance.

The reconstitution of these two curves, M1 and M2, may be done either digitally, or analogically.

The invention will be all the more efficient when the two points correspond to very different sensitivities. For example, in the case of a design of a junction with adjusted tunnel magnetoresistance with antisymmetric barriers, the sensitivity to the external magnetic field may even be reversed at high voltage.

The device according to the invention thus makes it possible to separate the variations in resistance of a magnetoresistive sensor due to low frequency noise and the variations in resistance due to the effect of the external magnetic field B. In other words, the device according to the invention makes it possible to suppress the low frequency noise of magnetoresistive sensors.

The device according to the invention may also have one or more of the characteristics below, considered individually or according to all technically possible combinations thereof:
the device D for measuring a magnetic field B includes two tunnel magnetoresistance sensors 301, 302 arranged according to a half-bridge arrangement and a low noise preamplifier PA, the two tunnel magnetoresistance sensors C having an inverse response to the magnetic field, the half-bridge arrangement including a first arm B1 and a second arm B2, the two arms being connected in parallel, each of the arms including a resistor R and one of the tunnel magnetoresistance sensors 301, 302, the half-bridge arrangement further including a first V+ and a second V− output, the two outputs being connected to the low noise preamplifier PA, each output V+, V− being the junction point between one of the resistors R and one of the tunnel magnetoresistance sensors 301, 302;

the measuring device D includes a first 401, 401a and a second 402, 402a pair of tunnel magnetoresistance sensors and a low noise preamplifier PA, the sensors of the first pair 401, 401a having an inverse response compared to the sensors of the second pair 402, 402a, the tunnel magnetoresistance sensors 401, 401a, 402, 402a being arranged according to a bridge arrangement, the bridge arrangement including a first arm B1 and a second arm B2, the two arms being connected in parallel, each of the arms including a tunnel magnetoresistance sensor of the first pair 401, 401a and a tunnel magnetoresistance sensor of the second pair 402, 402a, the bridge arrangement further including a first V+ and a second V− output, the two outputs being connected to the low noise preamplifier PA, each output V+, V− being the junction point between a tunnel magnetoresistance sensor of the first pair 401, 401a and a tunnel magnetoresistance sensor of the second pair 402, 402a;

the half-bridge or bridge arrangement is connected to a voltage Vb, the voltage Vb being managed by the modulation means M;

the half-bridge or bridge arrangement is connected to a first voltage Vb/2 and to a second voltage −Vb/2, the voltage Vb being managed by the modulation means M;

each tunnel magnetoresistance sensor C is formed by a set of tunnel magnetoresistance junctions connected in series;

the measuring device D includes local heating means so as to flip the reference layer 703, 704 of at least one of the tunnel magnetoresistance sensors;

the modulation means M include a high frequency master clock for the generation of a switching signal between the first operating point 801 and the second operating point 802;

the switching signal includes a time variable voltage signal Vb, said signal being connected to the half-bridge arrangement or to the bridge arrangement, the signal Vb being intended to switch the tunnel magnetoresistance sensors between the first operating point 801 and the second operating point 802;

the processing means T of the signal derived from the device D for measuring a magnetic field B include a device for rapid digital acquisition of the signal derived from the preamplifier PA;

the means T for processing the signal derived from the device D for measuring a magnetic field B include:
A first Sample and Hold circuit intended to record the signal M1 measured by the measuring device D at the first operating point 801;
A second Sample and Hold circuit intended to record the signal M2 measured by the measuring device D at the second operating point 202;

A digital or analogue acquisition system 1301 for the linear combination of the signals derived from the first and second Sample and Hold circuits.

the master clock further generates a first control signal of the first Sample and Hold circuit and a second control signal of the second Sample and Hold circuit.

Another subject matter of the invention is a method for suppressing low frequency noise associated with the measurement of a magnetic field by a measuring device including at least one magnetoresistive sensor, said method including the following steps:

Identifying a first and a second operating point of the at least one magnetoresistive sensor, the magnetoresistive sensor having a first sensitivity at the first operating point and a second sensitivity at the second operating point, the sensitivity at the second operating point being low or zero;

Modulating the sensitivity of the magnetoresistive sensor by switching the magnetoresistive sensor from the first operating point having the first sensitivity to the second operating point having the second sensitivity and from the second operating point to the first operating point;

During the modulation, measuring a first response of the measuring device D in the presence of the magnetic field at the first operating point S1 and a second response M2 of the measuring device in the presence of the magnetic field at the second operating point;

Calculating a linear combination of the first response M1 and the second response M2 of the measuring system D.

The first step of the method according to the invention makes it possible to identify the two operating points of the tunnel magnetoresistance sensors comprised in the device D, the two operating points having two different sensitivities.

Advantageously, the second operating point is chosen so as to have a sensitivity to the magnetic field different from the first operating point. This makes it possible to differentiate fluctuations in resistance due to low frequency noise of the sensor C from variations in resistance due to the external magnetic field.

The sensitivity of the sensor is next modulated, for example using modulation means M, so as to switch the tunnel magnetoresistance sensors of the device D between the two operating points.

It is thus possible to measure the response of the device D at the first and at the second operating points, so as to identify fluctuations in resistance mainly due to low frequency noise in condition of low or zero sensitivity of the tunnel magnetoresistance elements.

The method according to the invention may also have one or more of the characteristics below, considered individually or according to all technically possible combinations thereof:

the frequency of modulation MOD of the sensitivity of the tunnel magnetoresistance sensor C is greater than the frequency 101 at which low frequency noise becomes less than the thermal noise associated with the tunnel magnetoresistance sensor C;

the sensitivity of the tunnel magnetoresistance sensor C is at least two times greater than the frequency 101 at which low frequency noise becomes less than the thermal noise associated with the tunnel magnetoresistance sensor C;

the measuring device D includes two tunnel magnetoresistance sensors 301, 302 arranged according to a half-bridge arrangement and a preamplifier PA, the two tunnel magnetoresistance sensors having an inverse response to the magnetic field, the half-bridge arrangement including a first arm B1 and a second arm (B2), the two arms being connected in parallel, each of the arms including a resistor (R) and one of the tunnel magnetoresistance sensors 301, 302, the half-bridge arrangement further including a first V+ and a second V− output, the two outputs being connected to the low noise amplifier, each output V+, V− being the junction point between one of the resistors R and one of the tunnel magnetoresistance sensors 301, 302;

that the measuring device D includes a first 401, 401a and a second 402, 402a pair of tunnel magnetoresistance sensors and a low noise amplifier, the sensors of the first pair 401, 401a having an inverse response compared to the sensors of the second pair 402, 402a, the tunnel magnetoresistance sensors 401, 401a, 402, 402a being arranged according to a bridge arrangement, the bridge arrangement including a first arm B1 and a second arm B2, the two arms being connected in parallel, each of the arms including a tunnel magnetoresistance sensor of the first pair 401, 401a and a tunnel magnetoresistance sensor of the second pair 402, 402a, the bridge arrangement further including a first (V+) and a second V− output, the two outputs being connected to the low noise amplifier, each output V+, V− being the junction point between a tunnel magnetoresistance sensor of the first pair 401, 401a and a tunnel magnetoresistance sensor of the second pair 402, 402a;

the step MOD of modulation of the sensitivity of the at least one tunnel magnetoresistance sensor is carried out by application of a voltage V to the terminals of the tunnel magnetoresistance sensor C, so as to change the sensitivity of the tunnel magnetoresistance sensor C when the voltage V is applied;

the step of measuring MES the first response M1 of the measuring device D and the second response M2 of the measuring device D is carried out using a digital or analogue acquisition system 1101;

the step of linear combination LIN is carried out using a digital or analogue acquisition system 1301.

LIST OF FIGURES

Other characteristics and advantages of the invention will become clear from the description that is given thereof below, for indicative purposes and in no way limiting, with reference to the appended figures, among which:

Figure 7:
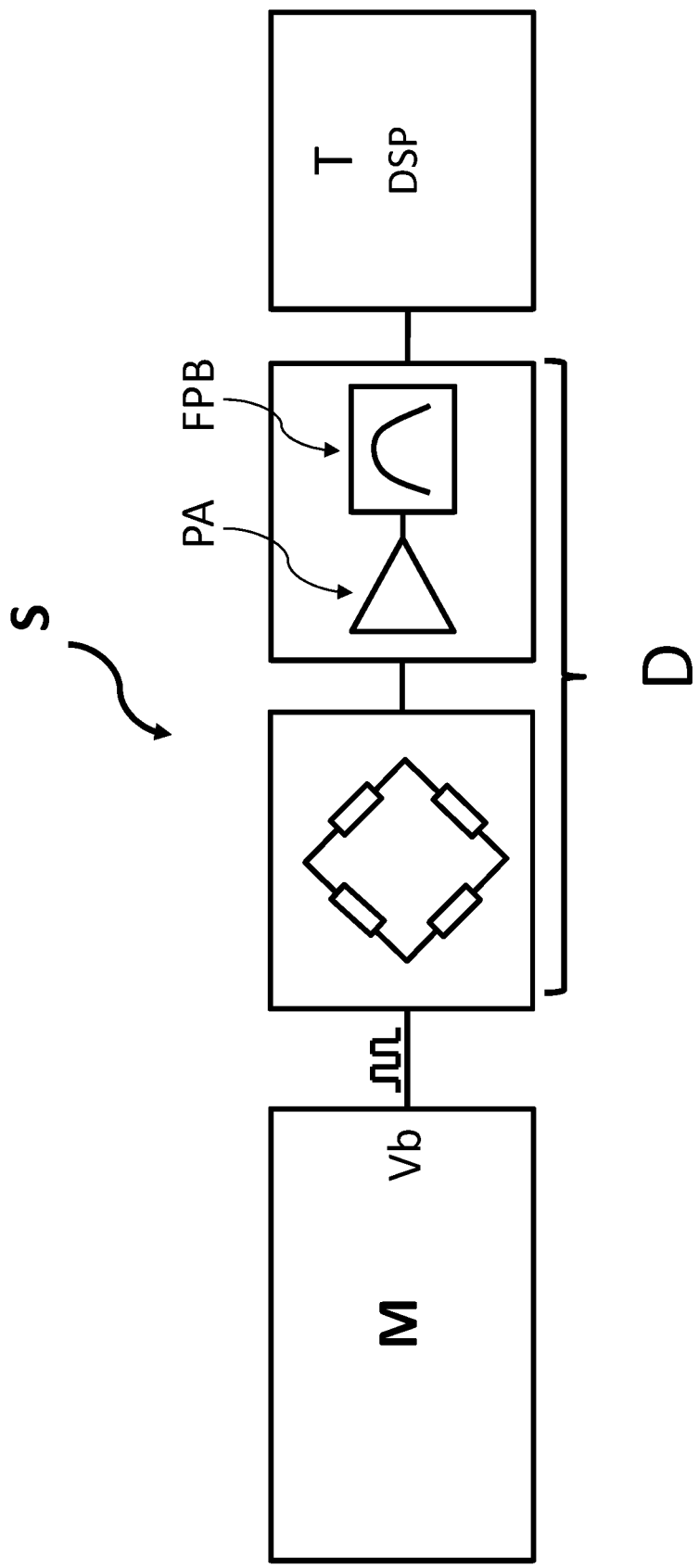
Figure 8:
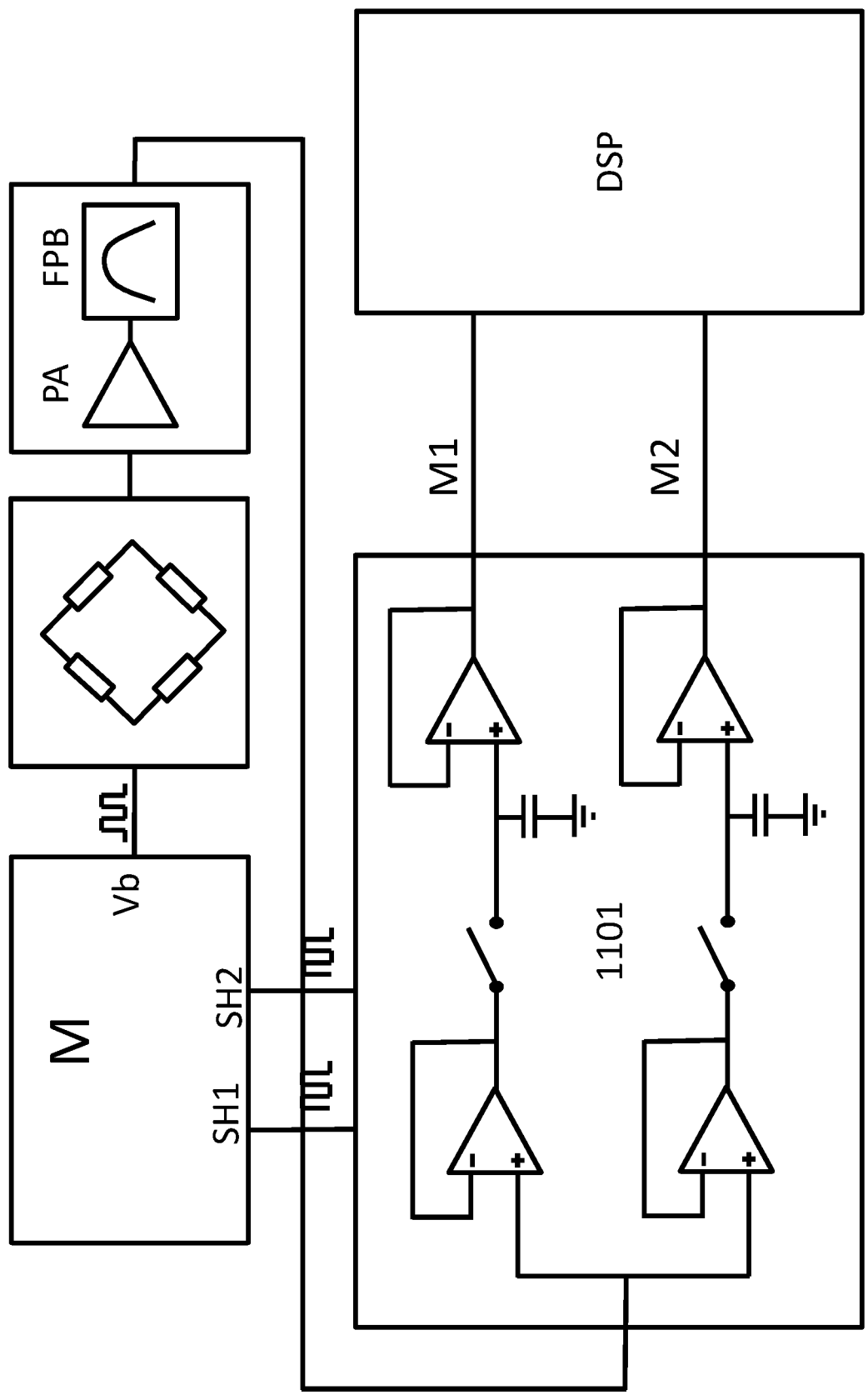
Figure 9:
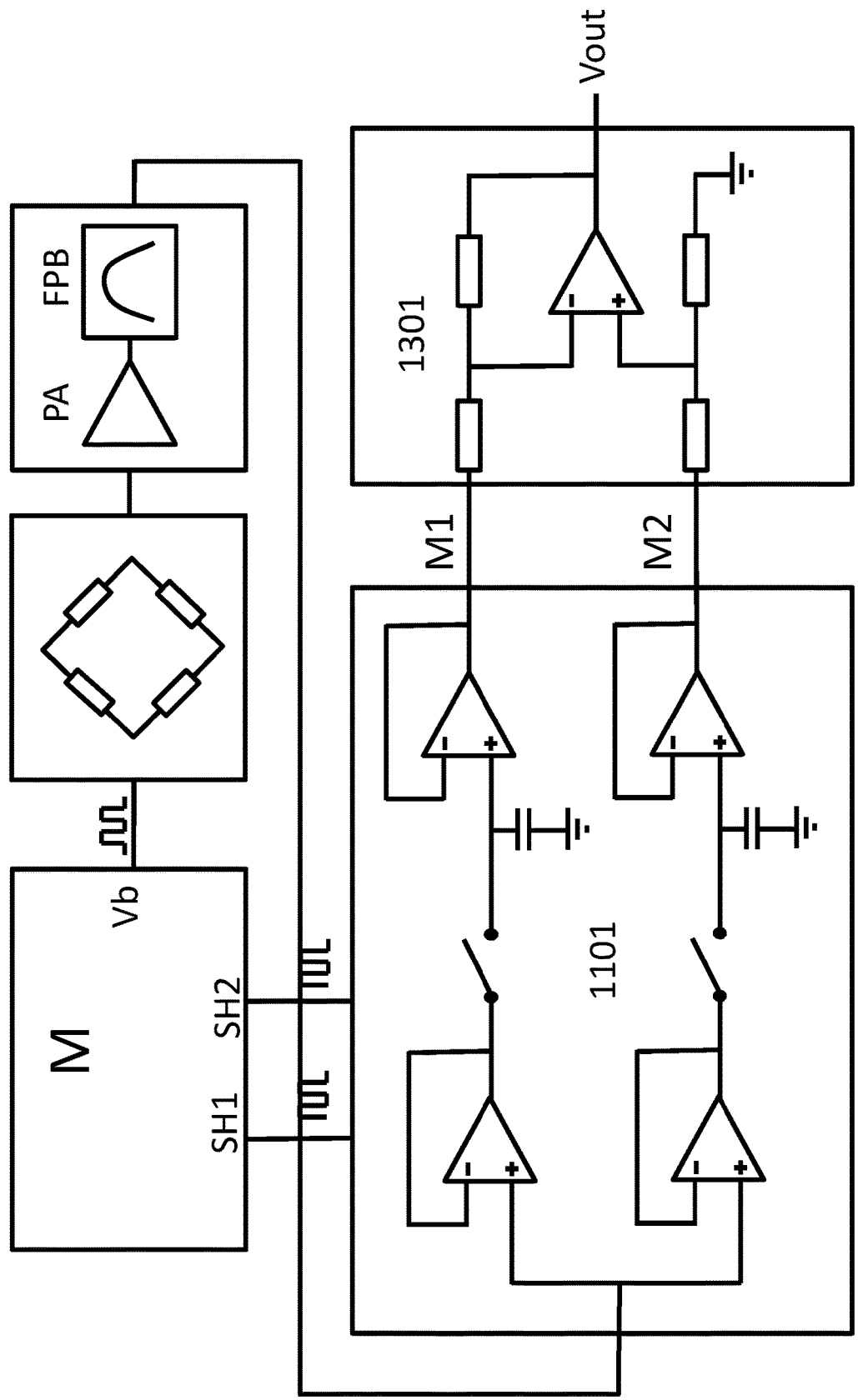
Figure 10:
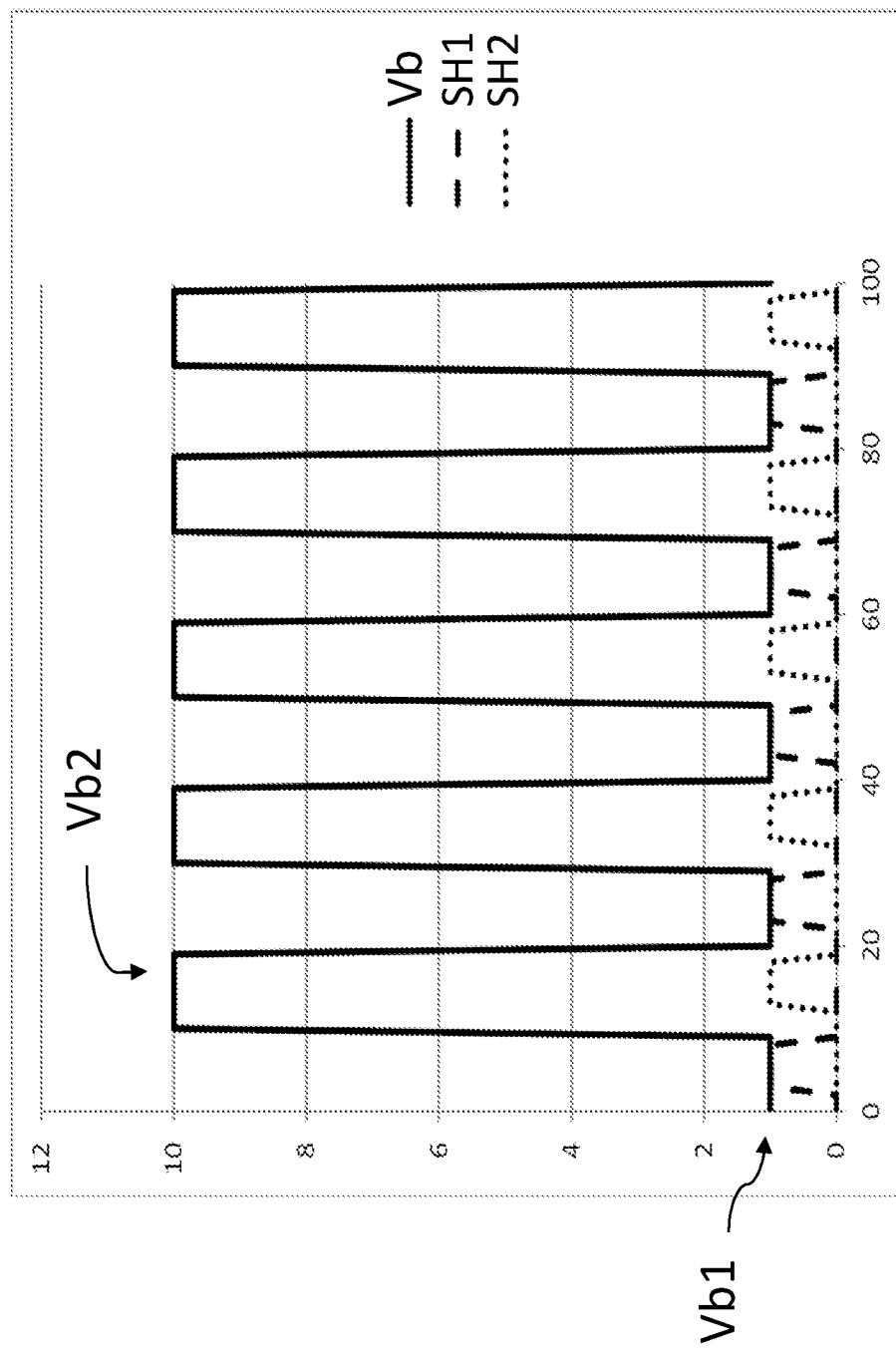
Figure 11:
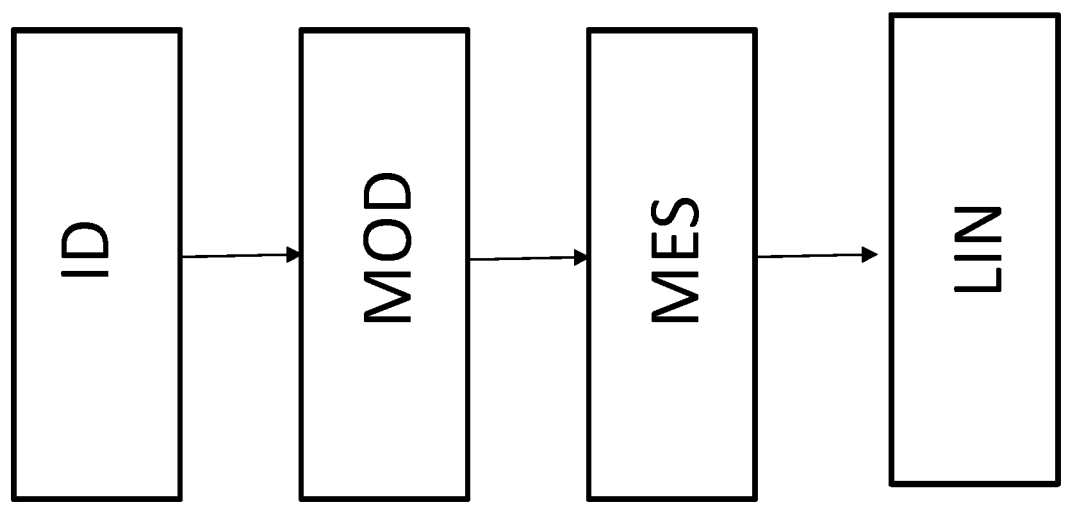

FIG. 7 schematically illustrates an embodiment of the system S for suppressing low frequency noise with digital processing of the signal derived from the measuring device D;

FIG. 8 shows the electronic diagram of an embodiment of the system S for suppressing low frequency noise making it possible to obtain the two curves M1 and M2 in an analogue manner and to perform a digital linear combination;

FIG. 9 shows the electronic diagram of an embodiment of the system S for suppressing low frequency noise making it possible to obtain the two curves M1 and M2 in an analogue manner and to perform an analogue linear combination;

FIG. 10 shows an example of signals derived from the modulation means M and making it possible to modulate the sensitivity of the tunnel magnetoresistance TMR sensors; FIG. 10 also shows the signals used to manage the analogue processing circuits of the signals M1 and M2;

FIG. 11 shows the steps of the method for implementing the system for reducing noise according to the invention.

DETAILED DESCRIPTION OF THE INVENTION

Figure 1:
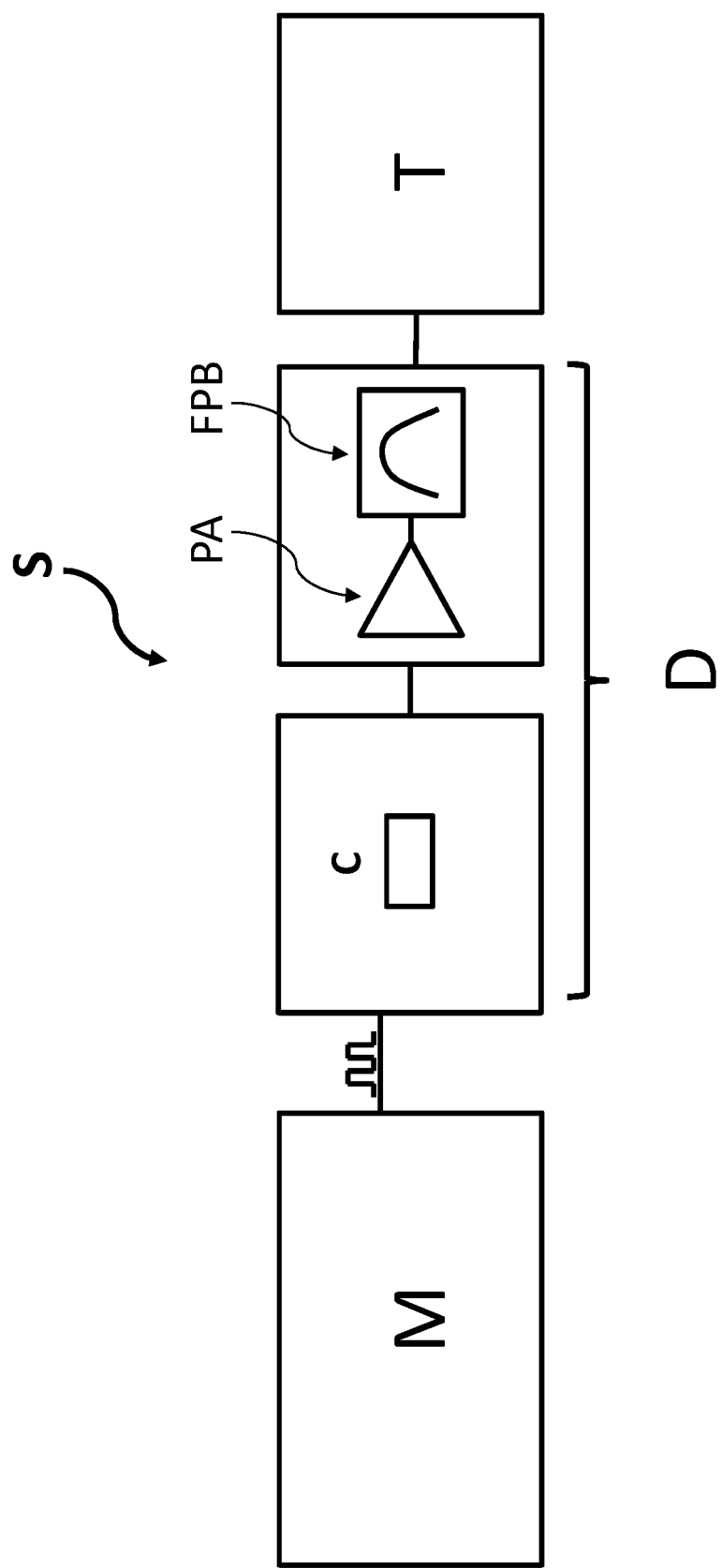
FIG. 1 shows a diagram of the system S for reducing low frequency noise according to a subject matter of the invention.

FIG. 1 shows an example of the system S for reducing low frequency noise according to the invention. The system S includes:
- modulation means M used to modulate the sensitivity of at least one tunnel magnetoresistive sensor C; the modulation means include for example a voltage generator or a function generator to generate a time variable voltage;
- a device D for measuring an external magnetic field B; the device D includes at least one tunnel magnetoresistance sensor C, a low noise amplifier PA for the amplification of the signal derived from the magnetoresistive sensor C and a bandpass filter FPB to eliminate the low and high frequency components of the signal measured by D; it is important to note that each magnetoresistive sensor forming part of the device D has different operating points with different sensitivities to the external magnetic field B; the device D supplies a first measurement M1 and a second measurement M2 derived from the device D;
- a device for processing the signal T to record the two measurements M1 and M2 and/or perform the linear combination of the first measurement M1 and the second measurement M2.

Figure 2:
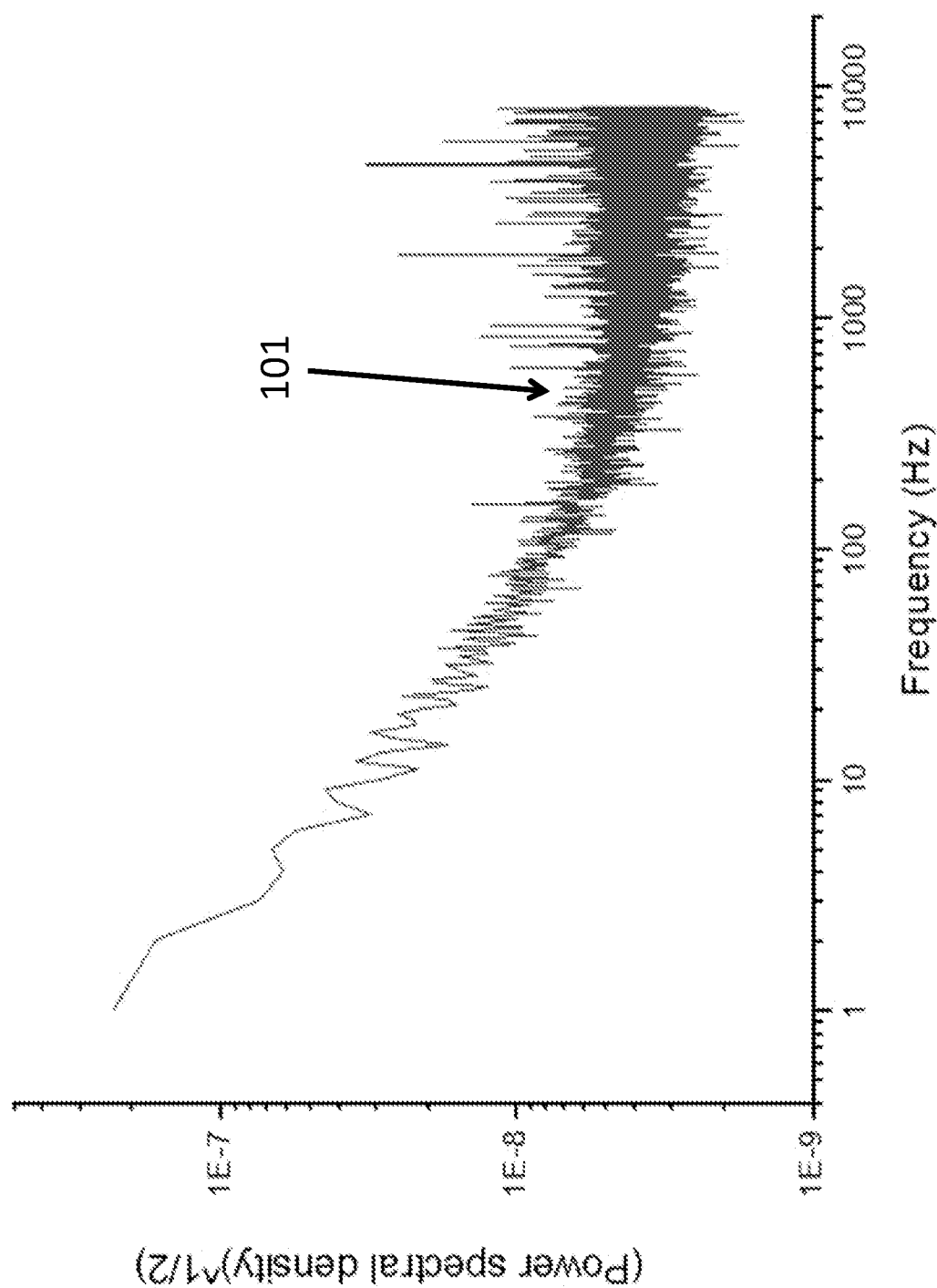
FIG. 2 shows the 1/f noise or low frequency noise spectral density.

FIG. 2 shows an example of 1/f noise spectral density of a magnetoresistive sensor. The noise spectral density is represented as a function of frequency. In this figure it may be seen that low frequency noise becomes less than thermal noise from the frequency 101. In this case, it is necessary that the oscillation frequency between the two operating points is greater than the frequency 101 and, if it is possible, at least two times greater than the frequency corresponding to the point 101.

The oscillation frequency between the two operating points having different sensitivities is also called frequency of modulation of the sensitivity of the magnetoresistive sensors.

Advantageously, it is better to choose a sufficiently high modulation frequency, that is to say above the frequency where the fluctuations in resistance become equal to the thermal noise.

Figure 3A:
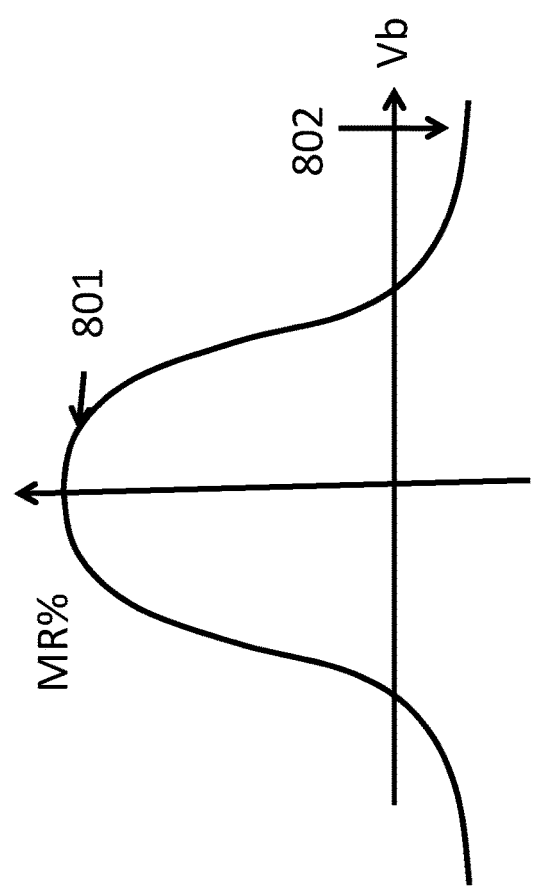
FIG. 3a shows the variation in the magnetoresistance of a tunnel magnetoresistance TMR junction as a function of the voltage applied to the terminals of the junction.

FIG. 3a shows the variation in magnetoresistance of a tunnel magnetoresistance TMR junction as a function of the applied voltage Vb. The points 801 and 802 show the two points having different sensitivities and retained for the implementation of the invention.

Figure 3B:
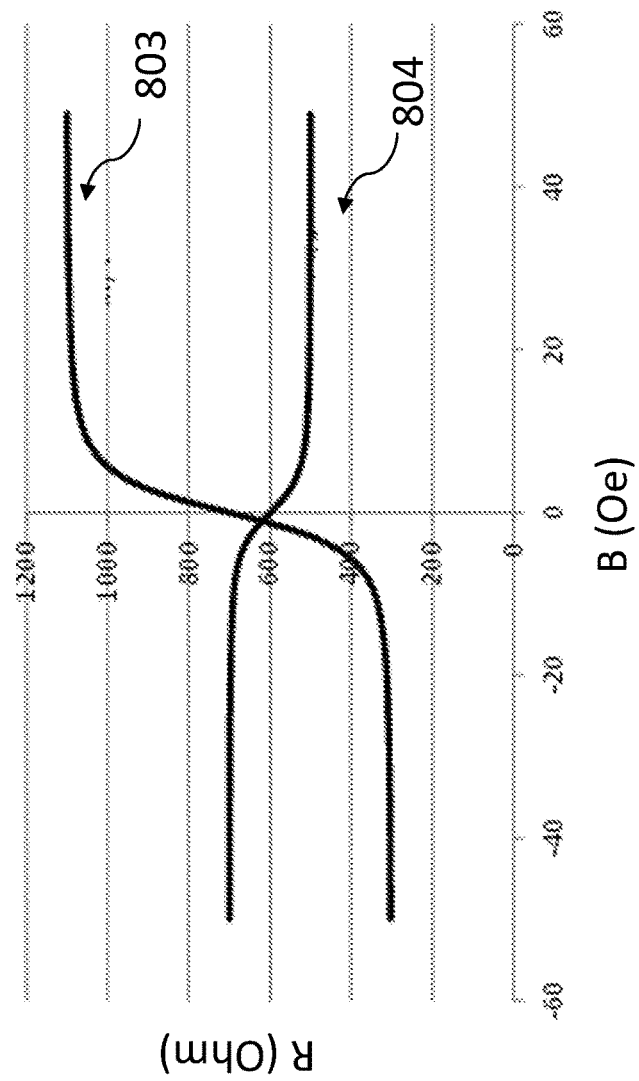
FIG. 3b shows the variations in resistance of a tunnel magnetoresistance TMR junction as a function of the external magnetic field.

FIG. 3b shows the variation in magnetoresistance of a tunnel magnetoresistance TMR junction as a function of the external field B. The curve 803 represents the variation in magnetoresistance as a function of the external field B at the operating point 801. The curve 804 represents the variation in magnetoresistance as a function of the external field B at the operating point 802.

In FIG. 3b it may be seen that thanks to the application of the voltage Vb the sensitivity to the external magnetic field decreases and may be inversed.

Figure 4:
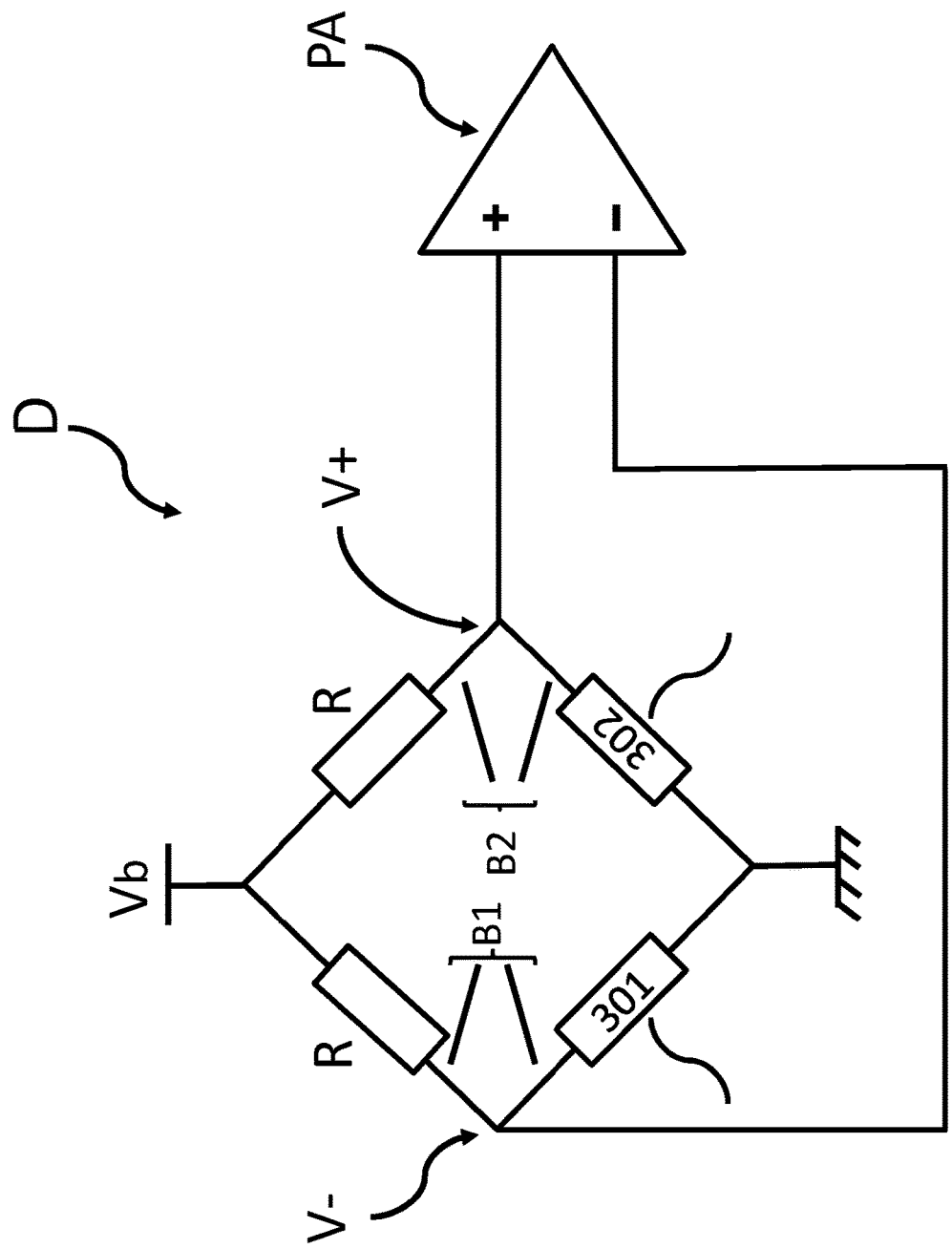
FIG. 4 shows a first example of measuring device D associated with the system S for reducing low frequency noise such as given in FIG. 1; in this case a half-bridge arrangement with two magnetoresistive elements is represented.

FIG. 4 shows a first embodiment of the measuring device D of the system S according to the invention. According to this embodiment, the measuring device D includes two tunnel magnetoresistance sensors 301 and 302 and two identical resistors R. These four elements are connected according to a half-bridge arrangement illustrated in FIG. 4.

In particular, the half-bridge arrangement includes a supply voltage Vb connected to a first arm B1 and to a second arm B2. The two arms are connected in parallel. The end of the arms B1 and B2 opposite to the end connected to the voltage Vb is connected to earth. Each of the two arms B1 and B2 includes a resistor R and a tunnel magnetoresistance element 301, 302. In the example illustrated in FIG. 4, the supply voltage Vb is connected to the junction point between the two resistors R. Alternatively, the voltage Vb may be connected to the junction point between the two tunnel magnetoresistance sensors 301 and 302.

Each arm B1, B2 of the arrangement of FIG. 4 includes an output V−, V+. The two outputs V−, V+ are connected to a low noise amplifier PA.

The two magnetoresistive sensors 301 and 302 have an inverse response to the external field. In other words, under the action of the external and uniform magnetic field in the volume occupied by the bridge of FIG. 4, an increase in magnetoresistance of the first magnetoresistive sensor 301 corresponds to a decrease in magnetoresistance of the second magnetoresistive sensor 302.

Advantageously, this makes it possible to measure a potential difference between the two outputs V+ and V−, which is proportional to the external magnetic field B to measure.

To implement the invention, it is necessary to modulate the sensitivity of the magnetoresistive sensors with tunnel magnetoresistance 301 and 302 between the first operating point 801 having a first sensitivity S1 and the second operating point 802 having a second sensitivity S2. This modulation may be obtained by applying a time variable voltage Vb and displacing the operating point of the tunnel magnetoresistance sensors from the first operating point 801 to the second operating point 802 and vice-versa. The voltage Vb may be managed by the modulation means M.

Advantageously, the half-bridge arrangement makes it possible to have an output independent of the operating point of the magnetoresistive sensors. In other words, the differential output voltage of the bridge of FIG. 4 when the magnetoresistive elements are at the first operating point 801 is close to the differential voltage when the magnetoresistive elements are at the saturation point.

This configuration is very advantageous because in both cases it is possible to amplify the output voltage of the bridge without saturating the low noise amplifier PA.

Figure 5A:
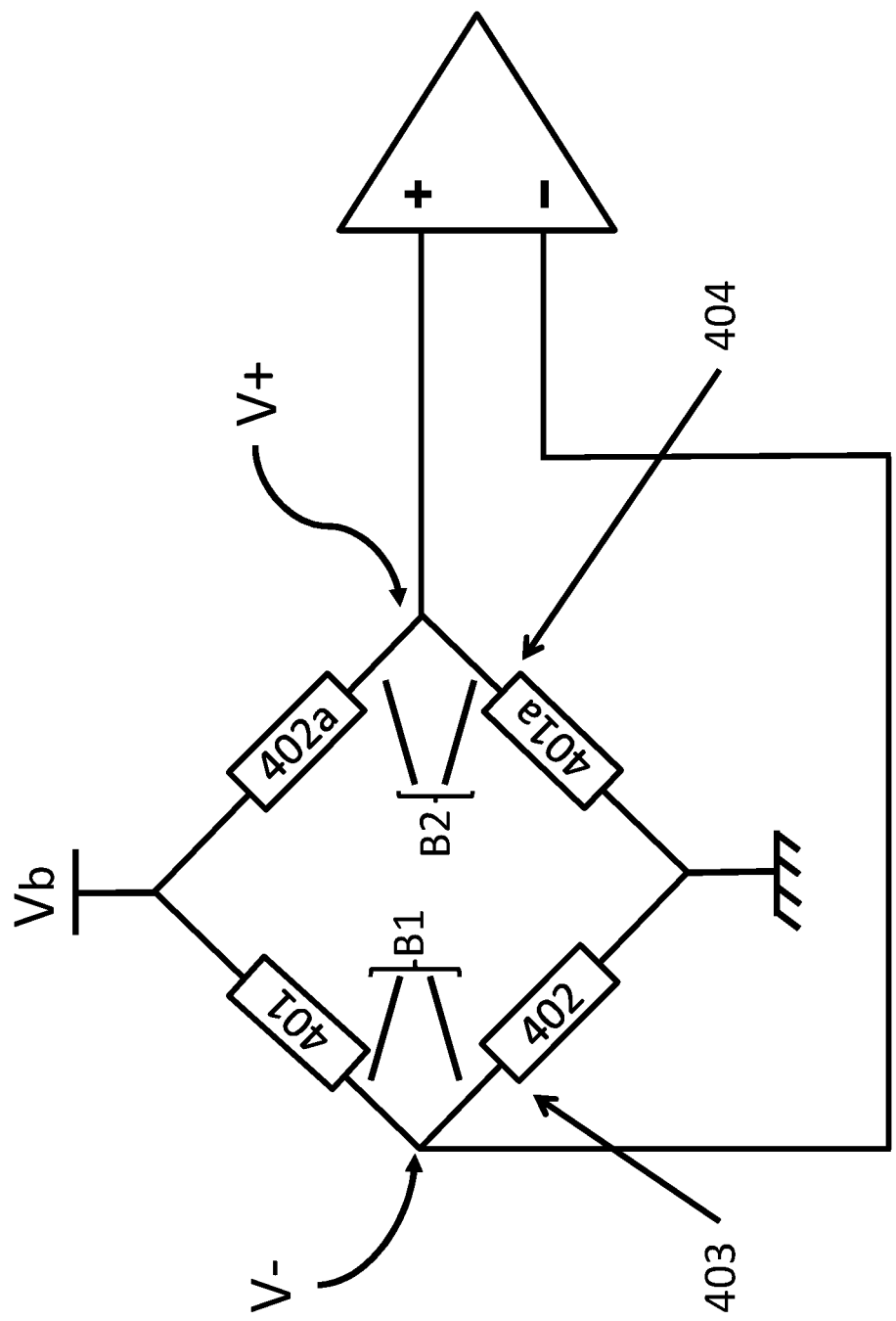
FIG. 5a shows a second example of measuring device D associated with the system S for reducing low frequency noise such as given in FIG. 1; in this case a complete bridge arrangement with four magnetoresistive elements is represented.

FIG. 5a shows a second embodiment of the measuring device D for the system S for reducing low frequency noise. In this case there is a complete bridge arrangement with four tunnel magnetoresistance elements. The elements 401 and 401a have an inverse response to the external magnetic field B compared to the elements 402 and 402a.

The operation of the circuit of FIG. 5a is similar to the operation of FIG. 4. The operating point of the tunnel magnetoresistance sensors may be changed by applying a time variable voltage Vb. The voltage Vb may be managed by the modulation means M.

Advantageously, the bridge arrangement makes it possible to have an output independent of the operating point of the magnetoresistive sensors with tunnel magnetoresistance and on the other hand makes it possible to gain a factor 2 on the output amplitude.

Both in the case of the half-bridge arrangement illustrated in FIG. 4 and in the case of the bridge arrangement illustrated in FIG. 5a, the magnetoresistive elements must have an inverse response to the external magnetic field. This inverse response may be obtained according to already known methods: the first consists in mounting 4 identical but physically inversed sensors. This method is simple to use but requires having two independent silicon dies and thus has a higher commercial cost. The second method consists in flipping by local heating means the reference layer of the two magnetoresistive elements 402, 402a by local under field heating. The third method consists in depositing two slightly different stacks which have inverse but very similar responses. In a preferential embodiment, the second method is applied, which makes it possible to have a method that can be industrialised at low cost.

The first operating point 801 of the tunnel magnetoresistance sensor corresponds to a current such that the voltage at the terminals of the tunnel magnetoresistance element gives it very great sensitivity. A typical voltage value is 100 mV per junction. In this preferential embodiment, a series of tunnel magnetoresistance junctions, typically 20 to 30 in series, are used in order to have an output voltage of the order of 2V or 3V for the first operating point, which is the mode where the magnetoresistance elements are the most sensitive. In this case, each tunnel magnetoresistance sensor C is formed by a series of tunnel magnetic TMR junctions.

Figure 5B:
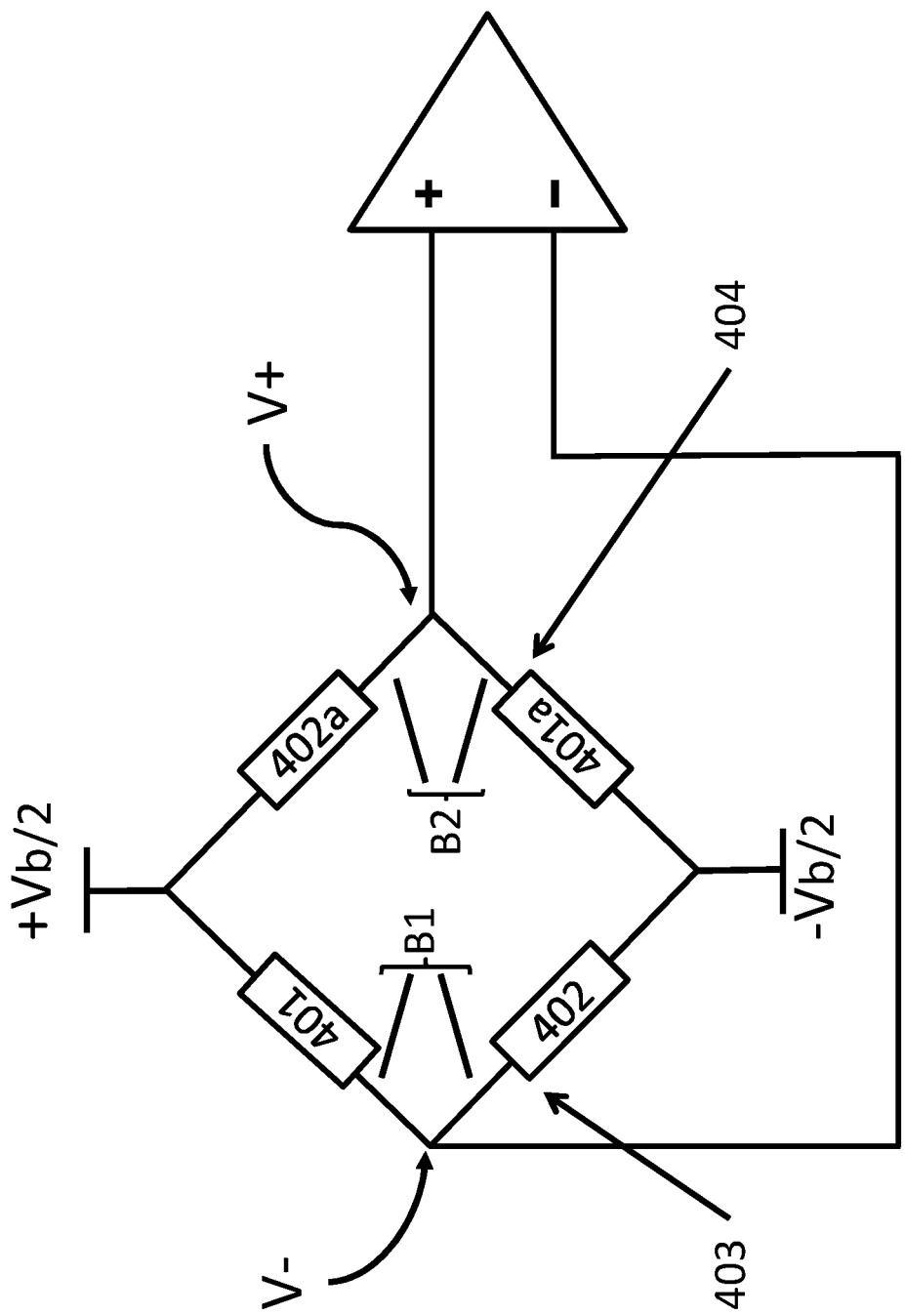
FIG. 5b shows a third example of measuring device D associated with the system S for reducing low frequency noise such as given in FIG. 1; in this case the bridge is supplied symmetrically.

The second operating point corresponds to a current in the tunnel magnetoresistance sensor producing a voltage of the order of a volt per element, thus 20 to 30V for a series of elements. In order to simplify the downstream electronics, it is possible to supply the bridge with symmetrical voltage as shown in FIG. 5b. At this moment, the first point corresponds to +−1V on the bridge and the second point to +−10V on the bridge. In this case, the input preamplifier PA is not saturated.

There may be rapid small transients during the application of the current and its suppression. Advantageously, the voltage Vb or the voltages +/−Vb/2 may be managed by the modulation means M. For example, a first value of Vb corresponds to the first configuration of the modulation means M and a second value of Vb corresponds to the second configuration of the modulation means M.

Advantageously, the operating point of the tunnel magnetoresistance elements may be controlled thanks to the modulation means M.

The device D of the system S according to the invention is thus capable of supplying a first measurement M1 corresponding to the first operating point of the tunnel magnetoresistance sensors. This first measurement M1 corresponds to points of type 801 in FIG. 3a. The device D is also capable of supplying a second measurement M2 corresponding to the second operating point of the tunnel magnetoresistance sensors. The second measurement M2 correspond to points of type 802 in FIG. 3b.

Advantageously, the measurements M2 and M1 are independent curves containing both fluctuations in resistance due to the external magnetic field B and intrinsic fluctuations in resistance corresponding to low frequency noise.

By performing a linear combination of the measurements M1 and M2 it is thus possible to eliminate low frequency noise. In the mode 801, the signal is the sum of fluctuations in resistance at voltage Vb1 and the external field multiplied by the sensitivity at this point. In the mode 802, the signal is the sum of fluctuations in voltage resistance Vb2 and the sensitivity at this point. In order to have a value of the field independent of fluctuations in resistance, it is necessary to perform a subtraction of the signal obtained at the point 801 and the signal obtained at the point 802 multiplied by VB1/VB2.

Figure 6:
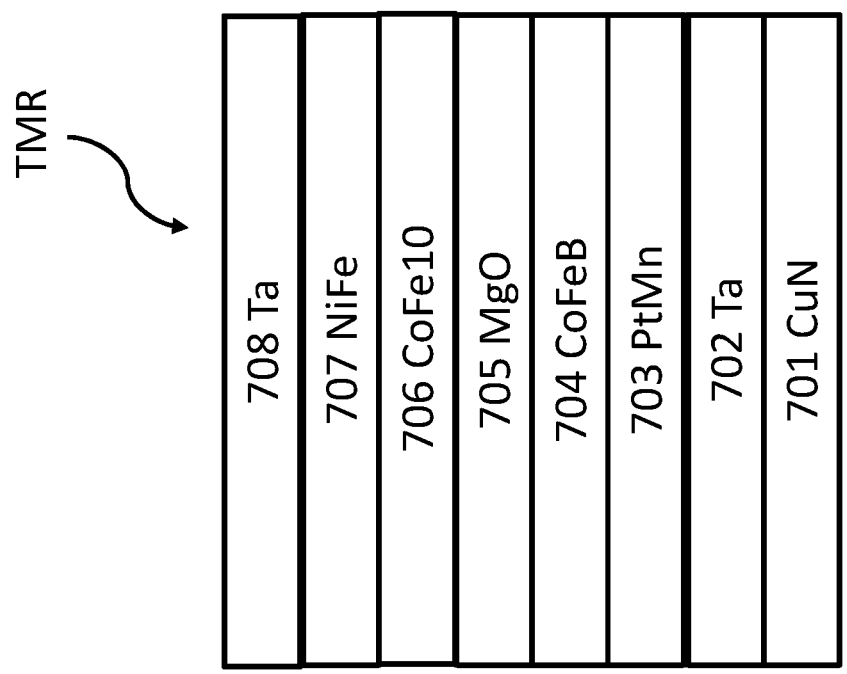
FIG. 6 shows a typical stack of a tunnel magnetoresistance TMR junction.

FIG. 6 shows a typical stack of a tunnel magnetoresistance TMR junction. The layer 701, often an alloy of Cu or CuN type, serves as lower electrode. The layer 702 serves as growth layer. The layers 703, an antiferromagnetic of PtMn or IrMn type coupled to a layer of CoFeB 704 type, serve as reference. The barrier is formed of $Al_2O_3$ or preferentially MgO 705. The layers 706 and 707 form a conventional free layer. That is to say a layer that follows the external field. The layer 708 serves as protection and starting point for the upper contact of the tunnel junction.

Numerous alternatives of stack known from the literature exist. The asymmetric stack given here makes it possible to have an inverse sensitivity at high voltage.

A magnetoresistive sensor with tunnel magnetoresistance C may include a single TMR junction or a multiplicity of TMR junctions connected in series.

FIG. 7 shows an exemplary embodiment of the system S according to the invention in the case of direct digital acquisition and digital reconstruction of the noise-free signal.

The modulation means M generate a periodic signal Vb of frequency f and of adjustable pulse width. Indicatively, f will often lie between 10 kHz and 10 MHz depending on the size of the TMR chosen. The signal Vb supplies the half-bridge of FIG. 4 or the bridge of FIG. 5a. Alternatively, the modulation means M can supply the voltages +/−Vb/2 for the supply of the bridge of FIG. 5b. A typical value of width of the pulses constituting the signal Vb is 50% of the total cycle. An example of signal Vb is the signal 1601 of FIG. 10. In output of the bridge, a low noise preamplifier PA as well as a filter FPB cutting frequencies above and well below f condition the signal that is digitally acquired, converted and processed by the digital processing means DSP.

The modulation means M according to the embodiment of FIG. 7 include for example a voltage generator, a pulse generator or a function generator to generate the time variable signal Vb. The signal Vb may be a square signal such as the signal Vb illustrated in FIG. 10. It is important to note that the signal Vb illustrated in FIG. 10 varies between a first value Vb1 corresponding to the first configuration of the modulation means M and a second value Vb2 corresponding to the second configuration of the modulation means M. According to the embodiment represented in FIG. 10, Vb1 is less than Vb2.

The first configuration of the modulation means M corresponds to the first operating point 801 of the tunnel magnetoresistance sensors C and the second configuration of the modulation means M corresponds to the second operating point 802 of the tunnel magnetoresistance sensors C.

The very low noise preamplifier PA must have a bandwidth of at least 5 times the switching speed.

The digital signal processing means DSP carry out a very rapid acquisition, typically at a sampling frequency around 10 MHz. The signal is acquired directly in output of the filter FPB. In this case, all the processing is done in a digital manner. The points after each field transition applied are averaged. In this way, the two curves M1 and M2 are reconstructed. These two curves are next subtracted to obtain the noise-free signal.

Advantageously, this embodiment is easy to implement, thanks to the use of digital signal processing means DSP.

Other embodiments are based on the use of analogue signal processing means T.

FIG. 8 shows an example of electrical diagram making it possible to obtain the two independent curves M1 and M2 in an analogue manner and a linear combination performed digitally thanks to the digital processing means DSP. In addition to modules already present in FIG. 7, a double Sample & Hold 1101 is inserted. It is commanded by the modulation means M which generate at this moment 3 signals. A first signal Vb is intended to supply a half-bridge or bridge type arrangement according to FIG. 4, 5a or 5b. Two signals SH1 and SH2 of amplitude and of pulse width are sent to the Sample & Hold 1101. Thus, the two S&H 1101 separate the measured signals when the tunnel magnetoresistance sensors C are at the first operating point 801, measurement M1, and when the tunnel magnetoresistance sensors are at the second operating point 802, measurement M2. The two signals M1 and M2 are stored, converted and subtracted to obtain the noise-free signal. These operations of storage and subtraction of the measurements M1 and M2 are carried out by the digital signal processing means DSP.

More specifically, the operation of the two S&H circuits 1101 is explained in relation to FIG. 10 which shows the signals generated by the function generator comprised in the modulation means M. The x-axis scale is in μs for purely illustrative and non-limiting purposes.

The function generator has the role of a master clock at high frequency f typically 1 MHz and generates three signals Vb, SH1, SH2. The signal Vb manages the putting in place of the switching of the tunnel magnetoresistance sensors C and makes it possible to go from the first operating point 801 to the second operating point 802. The signal SH1 manages a first S&H 1101, the signal SH2 manages the second S&H 1101.

FIG. 10 shows that a first S&H circuit is in acquisition mode while the signal Vb has a first value Vb1, which corresponds to the first operating point 801 of the tunnel magnetoresistance sensors C of the device D. This first S&H circuit makes it possible to work back to the measurement M1. Conversely, the second S&H circuit is in acquisition mode when the signal Vb has a second value Vb2, which corresponds to the second operating point 802 of the tunnel magnetoresistance sensors C of the device D. This second S&H circuit makes it possible to work back to the measurement M2.

The first configuration of the modulation means M corresponds to the low level of the signal Vb: the tunnel magnetoresistance sensors C are at the first operating point 301. The second configuration of the modulation means M corresponds to the high level of the signal Vb: the tunnel magnetoresistance sensors C are at the second operating point.

Advantageously, this manner of managing the S&H circuits makes it possible to separate the measurements M1 and M2 using an electronic that is simple to produce and of low cost.

The time shift between the signal Vb and the two signals SH1 and SH2 is such as the S&H circuits are placed in acquisition mode after a short time at the end of switching and in memory mode before the following switching, as shown in FIG. 12.

Advantageously, this time shift makes it possible to separate the transients that follow a switching and to make the elimination of low frequency noise more precise.

FIG. 9 shows a third exemplary embodiment of the system S according to the invention, with a step of entirely analogue processing of the signal. Unlike the device of FIG. 8, this time the digital signal processing means DSP are replaced by a subtraction circuit 1301 capable of performing the subtraction of the two measurements M2 and M1 in an analogue manner.

Advantageously, the system of FIG. 11 is a totally analogue system and potentially integrable at the level of the sensor, making these steps of modulation and subtraction transparent for the user.

FIG. 12 shows the steps of the method for implementing the system S according to the invention.

During a first step ID, the two operating points 801 and 802 of the tunnel magnetoresistance sensors C forming part of the device for measuring D the external field B are chosen. The points 801 and 802 are chosen so as to have two very different sensitivities to the external magnetic field B. The sensitivity S2 at the second operating point 802 can even be inversed compared to the sensitivity S1 at the first operating point 801.

During the second step MOD, the modulation means M are used to switch the tunnel magnetoresistance sensors C from the first operating point 801 having the first sensitivity S1 to the second operating point 802 having the second sensitivity S2 and from the second operating point 802 to the first operating point 801.

During the step MES, the response of the magnetoresistive sensors of the device D in the sensitivity zone and in the saturation zone is recorded, the modulation of the sensitivity of the magnetoresistive sensors still being underway. The response of the magnetoresistive sensors in the saturation zone, or measurement M2, essentially contains fluctuations in resistance due to low frequency noise. The response of the magnetoresistive sensors in the sensitivity zone, or measurement M1, contains variations in resistance due to variations in the external magnetic field, in addition to fluctuations due to low frequency noise. Two independent curves, M1 and M2 are thereby obtained, the two curves M1 and M2 being time dependent.

It is thus possible, during the step LIN, to perform a linear combination of the measurements M1 and M2 to obtain the noise-free signal and optionally a curve giving uniquely internal fluctuations in resistance associated with low frequency noise.

According to an embodiment, the linear combination of the step LIN consists in subtracting the two measurements M1 and M2.

According to another embodiment, during the step LIN the measurements M1 and M2 are linearly combined according to a formula of type M1−αM2. α is in general given by the ratio of the voltages applied in the measurement M1 and the measurement M2.

According to an embodiment of the method according to the invention, the frequency of modulation of the sensitivity of the tunnel magnetoresistance sensors is greater than the frequency 101 at which low frequency noise becomes less than the thermal noise associated with the magnetoresistive sensors.

According to an embodiment of the method, the frequency of modulation of the sensitivity of the sensor is at least two times greater than the frequency 101 at which low frequency noise becomes less than the thermal noise associated with the magnetoresistive sensors.

The step MES may be carried out using the measuring device D. The device D may be produced according to one of the configurations illustrated in relation to the system S according to the invention. These configurations are illustrated in FIGS. 4, 5a and 5b.

The steps MES and LIN may be carried out using means for processing the signal T. The processing means T may be digital, analogue or in part digital and in part analogue according to one of the configurations explained in relation to the system S according to the invention.

The invention claimed is:

1. System for suppressing low frequency noise of magnetoresistive sensors with tunnel magnetoresistance, said system comprising:
    a measuring device for measuring a magnetic field, said measuring device including at least one tunnel magnetoresistance sensor, said tunnel magnetoresistance sensor having a first sensitivity at a first operating point and a second sensitivity at a second operating point, the second sensitivity at the second operating point being different from the first sensitivity at the first operating point, said measuring device providing a first measurement when the tunnel magnetoresistance sensor is at the first operating point and a second measurement when the tunnel magnetoresistance sensor is at the second operating point, said first measurement corresponding to a first response of the measuring device in the presence of the magnetic field at the first operating point and said second measurement corresponding to a second response of the measuring device in the presence of the magnetic field at the second operating point;
    a modulator comprising a voltage generator or a function generator to generate a time variable voltage and configured to switch the tunnel magnetoresistance sensor from the first operating point to the second operating point and from the second operating point to the first operating point so that said measuring device provides said first measurement and said second measurement, said modulator having a first configuration corresponding to the first operating point and a second configuration corresponding to the second operating point, and
    a signal processor configured to process the signal derived from the measuring device, said signal processor being configured to make a linear combination of the first response of the measuring device in the presence of the magnetic field at the first operating point corresponding to the first configuration of the modulator and the second response of the measuring device in the presence of the magnetic field at the second operating point corresponding to the second configuration of the modulator.

2. The system for suppressing low frequency noise of tunnel magnetoresistance sensors according to claim 1, wherein each tunnel magnetoresistance sensor is formed by a set of tunnel magnetoresistance junctions connected in series.

3. The system for suppressing low frequency noise of magnetoresistive sensors with tunnel magnetoresistance according to claim 1, wherein the measuring device includes a local heating system so as to flip the reference layer of at least one of the tunnel magnetoresistance sensors.

4. The system for suppressing low frequency noise of tunnel magnetoresistance sensors according to claim 1, wherein the modulator includes a high frequency master clock for the generation of a signal for switching between the first operating point and the second operating point.

5. The system for suppressing low frequency noise of magnetoresistive sensors with tunnel magnetoresistance according to claim 1, wherein the measuring device for measuring a magnetic field includes two tunnel magnetoresistance sensors arranged according to a half-bridge arrangement and a low noise preamplifier, the two tunnel magnetoresistance sensors having an inverse response to the magnetic field, the half-bridge arrangement including a first arm and a second arm, the first and second arms being connected in parallel, each of the first and second arms including a resistor and one of the tunnel magnetoresistance sensors, the half-bridge arrangement further including a first and a second output, the first and second outputs being connected to the low noise preamplifier, each output being the junction point between one of the resistors and one of the tunnel magnetoresistance sensors.

6. The system for suppressing low frequency noise of magnetoresistive sensors with tunnel magnetoresistance according to claim 5, wherein the half-bridge arrangement is connected to a voltage Vb, the voltage Vb being managed by the modulator.

7. The system for suppressing low frequency noise of magnetoresistive sensors with tunnel magnetoresistance according to claim 5, wherein the half-bridge arrangement is connected to a first voltage Vb/2 and to a second voltage −Vb/2, the voltages Vb/2 and −Vb/2 being managed by the modulator.

8. The system for suppressing low frequency noise of magnetoresistive sensors with tunnel magnetoresistance according to claim 1, wherein the measuring device includes a first and a second pair of tunnel magnetoresistance sensors and a low noise preamplifier, the sensors of the first pair having an inverse response compared to the sensors of the second pair, the tunnel magnetoresistance sensors being arranged according to a bridge arrangement, the bridge arrangement including a first arm and a second arm, the first and second arms being connected in parallel, each of the first and second arms including a tunnel magnetoresistance sensor of the first pair and a tunnel magnetoresistance sensor of the second pair, the bridge arrangement further including a first and a second output, the first and second outputs being connected to the low noise preamplifier, each output being the junction point between a tunnel magnetoresistance sensor of the first pair and a tunnel magnetoresistance sensor of the second pair.

9. The system for suppressing low frequency noise according to claim 8, wherein the modulator includes a high frequency master clock for the generation of a signal for switching between the first operating point and the second operating point, and wherein the switching signal the time variable voltage Vb, said signal being connected to the bridge arrangement, the voltage Vb being intended to switch the tunnel magnetoresistance sensors between the first operating point and the second operating point.

10. The system for suppressing low frequency noise of magnetoresistive sensors with tunnel magnetoresistance according to claim 8, wherein the bridge arrangement is connected to a voltage Vb, the voltage Vb being managed by the modulator.

11. The system for suppressing low frequency noise of magnetoresistive sensors with tunnel magnetoresistance according to claim 8, wherein the bridge arrangement is connected to a first voltage Vb/2 and to a second voltage −Vb/2, the voltages Vb/2 and −Vb/2 being managed by the modulator.

12. Method for suppressing low frequency noise associated with the measurement of a magnetic field by a measuring device including at least one tunnel magnetoresistance sensor, said method comprising:

identifying a first and a second operating point of the tunnel magnetoresistance sensor, the tunnel magnetoresistance sensor having a first sensitivity at the first operating point and a second sensitivity at the second operating point, the sensitivity at the second operating point being different from the first sensitivity, said measuring device providing a first measurement when the tunnel magnetoresistance sensor is at the first operating point and a second measurement when the tunnel magnetoresistance sensor is at the second operating point, said first measurement corresponding to a first response of the measuring device in the presence of the magnetic field at the first operating point and said second measurement corresponding to a second response of the measuring device in the presence of the magnetic field at the second operating point;

modulating the sensitivity of the tunnel magnetoresistance sensor by switching the tunnel magnetoresistance sensor from the first operating point having the first sensitivity to the second operating point having the second sensitivity and from the second operating point to the first operating point, the modulating being carried out with a modulator that comprises a voltage generator or a function generator to generate a time variable voltage and configured to switch said tunnel magnetoresistance sensor;

during the modulation, making said first and second measurements so as to measure first response of the measuring device in the presence of the magnetic field at the first operating point and a second response of the measuring device in the presence of the magnetic field at the second operating point, and calculating a linear combination of the first response and the second response of the measuring device.

\* \* \* \* \*